(12) United States Patent
Myung et al.

(10) Patent No.: US 10,796,818 B2
(45) Date of Patent: Oct. 6, 2020

(54) HEATING ELEMENT

(71) Applicant: LG CHEM, LTD., Seoul (KR)

(72) Inventors: Ji Eun Myung, Daejeon (KR); Sera Kim, Daejeon (KR); Jooyeon Kim, Daejeon (KR); Chang Yoon Lim, Daejeon (KR); Seung Heon Lee, Daejeon (KR); Mun Seop Song, Daejeon (KR); Kwang Joo Lee, Daejeon (KR); Ji Young Hwang, Daejeon (KR)

(73) Assignee: LG CHEM., LTD., Seoul (KR)

( * ) Notice: Subject to any disclaimer, the term of this patent is extended or adjusted under 35 U.S.C. 154(b) by 0 days.

(21) Appl. No.: 16/084,424

(22) PCT Filed: Dec. 23, 2016

(86) PCT No.: PCT/KR2016/015177
§ 371 (c)(1),
(2) Date: Sep. 12, 2018

(87) PCT Pub. No.: WO2017/188553
PCT Pub. Date: Nov. 2, 2017

(65) Prior Publication Data
US 2019/0080820 A1    Mar. 14, 2019

(30) Foreign Application Priority Data
Apr. 29, 2016    (KR) .................. 10-2016-0053158

(51) Int. Cl.
*H05K 1/03* (2006.01)
*H01B 5/14* (2006.01)
(Continued)

(52) U.S. Cl.
CPC ................ *H01B 5/14* (2013.01); *H05B 3/26* (2013.01); *H05B 3/265* (2013.01); *H05B 3/84* (2013.01);
(Continued)

(58) Field of Classification Search
CPC . H01B 5/14; H05B 3/265; H05B 3/84; H05B 3/26; H05B 2214/02; G06F 2203/04103; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245;
(Continued)

(56) References Cited

U.S. PATENT DOCUMENTS 5,057,461 A * 10/1991 Fritz .................. H01L 21/6835
29/827
2007/0036954 A1 * 2/2007 Ikishima ................ H05K 3/386
428/209
(Continued)

FOREIGN PATENT DOCUMENTS

EP    1170345 A2    1/2002
JP    7-179828 A    7/1995
(Continued)

*Primary Examiner* — Ishwarbhai B Patel
(74) *Attorney, Agent, or Firm* — Dentons US LLP

(57) ABSTRACT

The present specification relates to a heating element and a method for manufacturing the same.

6 Claims, 2 Drawing Sheets

(51) Int. Cl.
   *H05B 3/84* (2006.01)
   *H05B 3/26* (2006.01)
   *H05K 1/02* (2006.01)
   *H05K 1/11* (2006.01)

(52) U.S. Cl.
   CPC ......... *H05K 1/0201* (2013.01); *H05K 1/0313* (2013.01); *G06F 2203/04103* (2013.01); *H05B 2214/02* (2013.01); *H05K 1/03* (2013.01); *H05K 1/0306* (2013.01); *H05K 1/11* (2013.01)

(58) Field of Classification Search
   CPC .... H05K 1/0246; H05K 1/0248; H05K 1/025; H05K 1/0253; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/05; H05K 1/11; H05K 1/111; H05K 1/114; H05K 1/117; H05K 1/119; H05K 1/14; H05K 1/142; H05K 3/4602; H05K 3/4691; H05K 2201/09872; H05K 2201/10378
   See application file for complete search history.

(56) References Cited

U.S. PATENT DOCUMENTS

| | | |
|---|---|---|
| 2010/0239866 A1 | 9/2010 | Matsumura et al. |
| 2011/0017719 A1 | 1/2011 | Choi et al. |
| 2011/0062146 A1* | 3/2011 | Kuriki ...................... H05B 3/84 219/553 |
| 2011/0233182 A1* | 9/2011 | Baranski .................. H05B 3/86 219/203 |
| 2012/0034407 A1 | 2/2012 | Yamanaka et al. |
| 2012/0152930 A1* | 6/2012 | Chamberlain ........... H05B 3/84 219/203 |
| 2012/0292307 A1 | 11/2012 | Kim et al. |
| 2012/0302041 A1 | 11/2012 | Maeda et al. |
| 2013/0075383 A1 | 3/2013 | Kim |
| 2015/0129290 A1 | 5/2015 | Seong et al. |
| 2015/0299520 A1* | 10/2015 | Mansei ...................... C09J 4/00 428/78 |
| 2015/0299523 A1* | 10/2015 | Park .......................... C09J 7/00 428/354 |
| 2016/0278166 A1* | 9/2016 | Seong ...................... H05B 3/26 |
| 2016/0298007 A1* | 10/2016 | Niimi ........................ C09J 7/00 |
| 2016/0355705 A1 | 12/2016 | Kawano et al. |

FOREIGN PATENT DOCUMENTS

| | | |
|---|---|---|
| JP | 2004-158812 A | 6/2004 |
| JP | 2009-242733 A | 10/2009 |
| JP | 2010-186566 A | 8/2010 |
| JP | 5171425 B2 | 1/2013 |
| JP | 2015-179498 A | 10/2015 |
| JP | 2016-011099 A | 1/2016 |
| JP | 2016-20145 A | 2/2016 |
| KR | 10-2010-0135568 A | 12/2010 |
| KR | 10-2011-0083513 A | 7/2011 |
| KR | 10-2013-0032659 A | 4/2013 |
| KR | 10-2013-0118831 A | 10/2013 |
| KR | 10-2014-0048354 A | 4/2014 |
| KR | 10-2015-0062984 A | 6/2015 |
| WO | 2009116786 A2 | 9/2009 |

* cited by examiner

[Figure 1]
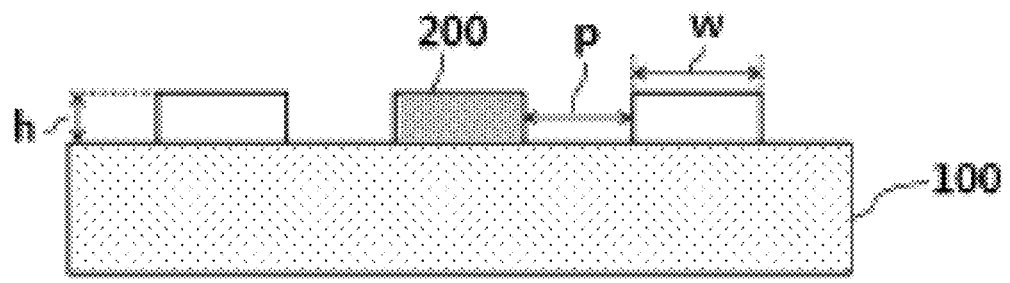
[Figure 2]
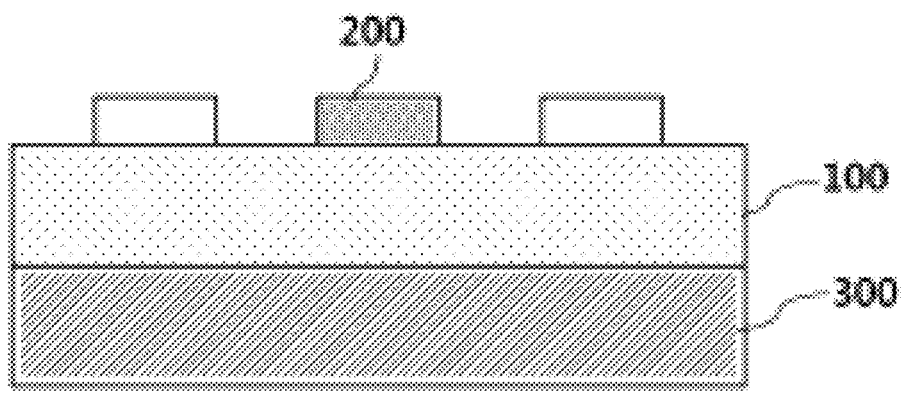
[Figure 3]
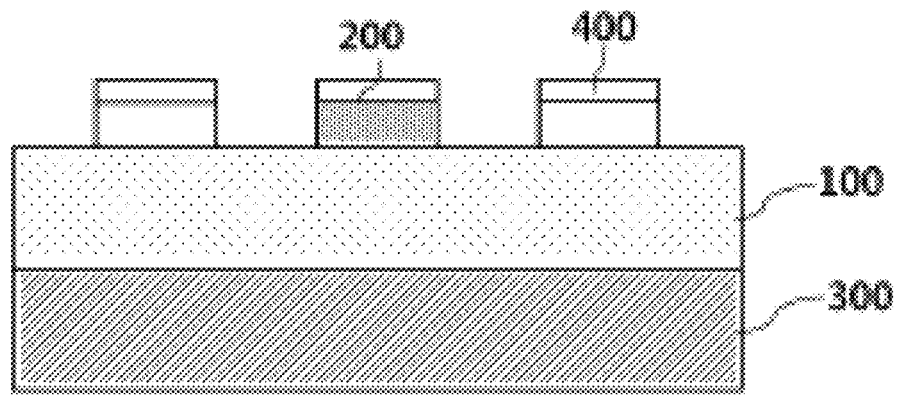

[FIG. 4]
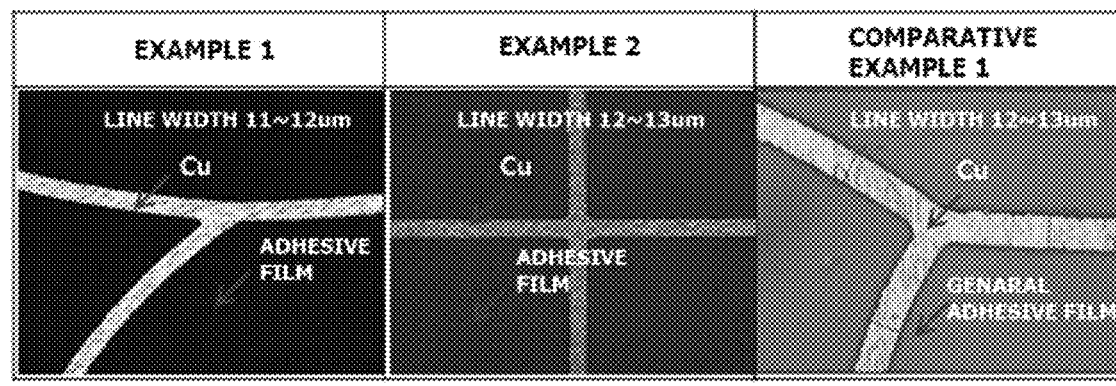

HEATING ELEMENT

TECHNICAL FIELD

This application is a National Stage Entry of International Application No. PCT/KR2016/015177, filed on Dec. 23, 2016, and claims the benefit of and priority to Korean Application No. 10-2016-0053158, filed on Apr. 29, 2016, all of which are hereby incorporated by reference in their entirety for all purposes as if fully set forth herein.

The present specification describes a heating element and a method for manufacturing the same.

BACKGROUND ART

Moisture or frost is formed on automotive glass when there is a temperature difference between outside and inside the automobile. Heating glass may be used in order to solve this problem. Heating glass uses a concept of forming a heating line by attaching a heating line sheet on the glass surface or directly forming a heating line on the glass surface, generating heat from the heating line by applying electricity to both terminals of the heating line, and increasing a temperature of the glass surface therefrom.

Particularly, methods employed for providing heating while having excellent optical performance to automotive front glass are largely divided into two types.

The first method is forming a transparent conductive thin film on the whole glass surface. The method of forming a transparent conductive thin film includes a method of using a transparent conductive oxide film such as ITO, or by forming a thin metal layer and then using transparent insulation films above and below the metal layer to increase transparency. This method has an advantage in that an optically superior conductive film may be formed, however, there is a disadvantage in that a proper heating value may not be obtained at low voltages due to a relatively high resistance value.

The second method may use a method of using a metal pattern or wire, and increasing transparency by maximizing a region having no patterns or wires. Typical products using this method include heating glass produced by inserting a tungsten wire to a PVB film used for bonding automotive front glass. In this method, the diameter of the used tungsten wire is 18 micrometers or greater, and conductivity capable of securing a sufficient heating value at low voltages may be obtained, however, there is a disadvantage in that the tungsten line is visually noticeable due to the relatively thick tungsten line. In order to overcome this problem, a metal pattern may be formed on a PET film through a printing process, or a metal pattern may be formed through a photolithography process after attaching a metal layer on a polyethylene terephthalate (PET) film. A heating product capable of heating may be produced by inserting the metal pattern-formed PET film between two polyvinyl butyral (PVB) films, and then going through a glass bonding process. However, there is a disadvantage in that, by a PET film being inserted between two PVB films, there may be a distortion in the objects seen through automotive glass due to refractive index differences between the PET film and the PVB film.

DISCLOSURE

Technical Problem

The present specification is directed to providing a heating element and a method for manufacturing the same.

Technical Solution

One embodiment of the present specification provides a heating element including an adhesive film; and a conductive heating pattern provided on the adhesive film, wherein the adhesive film has an adhesive strength decrement of 30% or greater by an external stimulus based on adhesive strength before the external stimulus.

Advantageous Effects

According to embodiments described in the present specification, a conductive heating pattern can be formed on a transparent substrate of an end product so that a transparent substrate for forming the conductive heating pattern does not remain in the end product. As above, by an adhesive film for forming a conductive heating pattern being removed, films other than a bonding film may not be additionally used between two transparent substrates of an end product, and view distortions caused by refractive index differences between the films can be prevented.

DESCRIPTION OF DRAWINGS

FIG. 1 illustrates a structure of a heating element according to a first embodiment of the present specification.

FIG. 2 illustrates a structure of a heating element according to a second embodiment of the present specification.

FIG. 3 illustrates a structure of a heating element according to a third embodiment of the present specification.

FIG. 4 shows images of Examples 1 and 2 and Comparative Example 1 measured using an optical microscope.

REFERENCE NUMERAL

100: Adhesive Film
200: Conductive Heating Pattern
300: Substrate
400: Darkening Pattern

MODE FOR DISCLOSURE

Hereinafter, the present specification will be described in detail.

A heating element according to one embodiment of the present specification includes an adhesive film; and a conductive heating pattern provided on the adhesive film.

The present specification relates to a metal pattern transfer film capable of improving optical properties and simplifying a process through forming a metal pattern in a form with no substrates by forming a metal pattern on an adhesive strength-controllable substrate and then transferring only the metal pattern to another substrate through controlling adhesive strength.

The adhesive film supports a metal film or a metal pattern before applying an external stimulus and needs to have no decoating or defects, and has adhesive strength reduced by an external stimulus afterward and needs to have favorable metal pattern transferability.

When forming a conductive heating pattern using an etching process after forming a metal film on the adhesive film, the adhesive film needs to have acid resistance and base resistance for an etching solution etching the metal film and a peel-off solution peeling off an etching protective pattern. Herein, acid resistance and base resistance of the adhesive film are determined by the adhesive film not going through visually observed color changes, all or a part thereof being not removed with dissolution, and whether the adhesive film maintains the same level of adhesive strength compared to the beginning after being impregnated in the etching solution or the peel-off solution.

The adhesive film is a film having adhesive strength controlled by an external stimulus, and specifically, may be a film having adhesive strength decreased by an external stimulus. The adhesive film may have an adhesive strength decrement of 30% or greater by an external stimulus based on adhesive strength before the external stimulus, and specifically, the adhesive film may have an adhesive strength decrement of greater than or equal to 30% and less than or equal to 100% by an external stimulus based on adhesive strength before the external stimulus, and more specifically, the adhesive film may have an adhesive strength decrement of greater than or equal to 50% and less than or equal to 100% and more favorably greater than or equal to 70% and less than or equal to 100% by an external stimulus based on adhesive strength before the external stimulus.

The external stimulus may be one or more of heat, light irradiation, a pressure and a current, and the external stimulus may be light irradiation, and may preferably be ultraviolet irradiation.

The ultraviolet irradiation may be carried out with light in an ultraviolet wavelength region with a range of 200 nm to 400 nm. Ultraviolet irradiation dose may be greater than or equal to 200 mJ/cm$^2$ and less than or equal to 1200 mJ/cm$^2$, and preferably greater than or equal to 200 mJ/cm$^2$ and less than or equal to 600 mJ/cm$^2$.

The adhesive film may have initial adhesive strength of 20 to 2000 (180°, gf/25 mm), and the adhesive strength of the adhesive film may be reduced to 1 to 100 (180°, gf/25 mm) by an external stimulus. Herein, adhesive strength of the adhesive film is measured using a 180° peel test measuring method, and specifically, is measured under a condition of a 180° angle and a 300 mm/s rate at room temperature. The specimen for the measurement is prepared by forming a metal film on an adhesive film, and cutting the result to have a width of 25 mm, and force (gf/25 mm) peeling off the adhesive film from the metal film is measured.

The thickness of the adhesive film is not particularly limited, however, adhesion efficiency is reduced as the adhesive film thickness decreases. The adhesive film may have a thickness of greater than or equal to 5 μm and less than or equal to 100 μm.

A composition for forming the adhesive film is not particularly limited, and for example, a composition for the adhesive film may include an adhesive resin, an initiator and a crosslinking agent.

The crosslinking agent may include one or more types of compounds selected from the group consisting of isocyanate-based compounds, aziridine-based compounds, epoxy-based compounds and metal chelate-based compounds. The composition for the adhesive composition may include the crosslinking agent in 0.1 parts by weight to 40 parts by weight with respect to 100 parts by weight of the adhesive resin. When the crosslinking agent content is too low, cohesiveness of the adhesive film may be insufficient, and when the crosslinking agent content is too high, adhesive strength of the adhesive film is not sufficiently secured before photocuring.

Specific examples of the initiator are not limited, and commonly known initiators may be used. In addition, the composition for the adhesive film may include the initiator in 0.1 parts by weight to 20 parts by weight with respect to 100 parts by weight of the adhesive resin.

The adhesive resin may include (meth)acrylate-based resins having a weight average molecular weight of 400,000 to 2,000,000.

In the present specification, (meth)acrylate means including both acrylate and methacrylate. Examples of the (meth)acrylate-based resin may include copolymers of (meth)acrylic acid ester-based monomers and crosslinking functional group-containing monomers.

The (meth)acrylic acid ester-based monomer is not particularly limited, and examples thereof may include alkyl (meth)acrylates, and more specifically, may include, as a monomer having an alkyl group with 1 to 12 carbon atoms, one, two or more types among pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate and decyl (meth)acrylate.

The crosslinking functional group-containing monomer is not particularly limited, and examples thereof may include one, two or more types among hydroxyl group-containing monomers, carboxyl group-containing monomers and nitrogen-containing monomers.

Examples of the hydroxyl group-containing compound may include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, 2-hydroxypropylene glycol (meth)acrylate or the like.

Examples of the carboxyl group-containing compound may include (meth)acrylic acid, 2-(meth)acryloyloxyacetic acid, 3-(meth)acryloyloxypropionic acid, 4-(meth)acryloyloxybutyric acid, acrylic acid dimers, itaconic acid, maleic acid, maleic anhydride or the like.

Examples of the nitrogen-containing monomer may include (meth)acrylonitrile, N-vinyl pyrrolidone, N-vinyl caprolactam or the like.

To the (meth)acrylate-based resin, at least one of vinyl acetate, styrene and acrylonitrile may be additionally copolymerized in terms of enhancing other functionalities such as compatibility.

The composition for the adhesive film may further include an ultraviolet curable compound. Types of the ultraviolet curable compound are not particularly limited, and, for example, multifunctional compounds having a weight average molecular weight of 500 to 300,000 may be used. Those having average knowledge in the art may readily select proper compounds depending on target applications. The ultraviolet curable compound may include multifunctional compounds having two or more ethylenically unsaturated double bonds.

The content of the ultraviolet curable compound may be from 1 part by weight to 400 parts by weight and preferably from 5 parts by weight to 200 parts by weight with respect to 100 parts by weight of the adhesive resin described above.

When the content of the ultraviolet curable compound is less than 1 part by weight, an adhesive strength decrease after curing is not sufficient causing concern of declining a transfer property, and the content being greater than 400 parts by weight may cause concern that cohesiveness of an adhesive before ultraviolet irradiation may be insufficient or peel-off with a release film and the like may not be readily achieved.

The ultraviolet curable compound may also be used in a form of carbon-carbon double bonds bonding to a side chain or main chain end of a (meth)acrylic copolymer of the adhesive resin as well as the addition-type ultraviolet curable compound. In other words, the ultraviolet curable compound may be introduced to a side chain of a (meth) acryl-based copolymer, the adhesive resin, by introducing the ultraviolet curable compound to a monomer for polymerizing a (meth)acryl-based copolymer, the adhesive resin, such as a (meth)acrylic acid ester-based monomer and a crosslinking functional group-containing monomer, or by additionally reacting the ultraviolet curable compound to the polymerized (meth)acryl-based copolymer.

Types of the ultraviolet curable compound are not particularly limited as long as it includes 1 to 5 and preferably 1 or 2 ethylenically unsaturated double bonds per one molecule, and has a functional group capable of reacting with a crosslinking functional group included in a (meth) acryl-based copolymer, the adhesive resin. Herein, examples of the functional group capable of reacting with a crosslinking functional group included in a (meth)acryl-based copolymer, the adhesive resin, may include an isocyanate group, an epoxy group or the like, but are not limited thereto.

Specific examples of the ultraviolet curable compound may include one, two or more types of, as those including a functional group capable of reacting with a hydroxyl group of the adhesive resin, (meth)acryloyloxy isocyanate, (meth) acryloyloxymethyl isocyanate, 2-(meth)acryloyloxyethyl isocyanate, 3-(meth)acryloyloxypropyl isocyanate, 4-(meth) acryloyloxybutyl isocyanate, m-propenyl-α,α-dimethylbenzyl isocyanate, methacryloyl isocyanate or allyl isocyanate;

acryloyl monoisocyanate compounds obtained by reacting diisocyanate compounds or polyisocyanate compounds with (meth)acrylic acid 2-hydroxyethyl;

acryloyl monoisocyanate compounds obtained by reacting diisocyanate compounds or polyisocyanate compounds, polyol compounds and (meth)acrylic acid 2-hydroxyethyl; or as those including a functional group capable of reacting with a carboxyl group of the adhesive resin, glycidyl (meth) acrylate, allyl glycidyl ether or the like, however, the ultraviolet curable compound is not limited thereto.

The ultraviolet curable compound may be included in a side chain of the adhesive resin by substituting 5 mol % to 90 mol % of a crosslinking functional group of the adhesive resin. When the amount of substitution is less than 5 mol %, a decrease in the peel-off strength caused by ultraviolet irradiation may not be sufficient, and when the amount of substitution is greater than 90 mol %, cohesiveness of the adhesive before ultraviolet irradiation may be reduced.

The composition for the adhesive film may properly include a tackifier such as a rosin resin, a terpene resin, a phenol resin, a styrene resin, an aliphatic petroleum resin, an aromatic petroleum resin or an aliphatic aromatic copolymerized petroleum resin.

A method of forming the adhesive film on a substrate is not particularly limited, and for example, may use a method of forming an adhesive film by directly coating the composition for the adhesive film of the present disclosure on a substrate, a method of preparing an adhesive film by coating the composition for the adhesive film on a detachable substrate first and then transferring the adhesive film on a substrate using the detachable substrate, or the like.

Methods of coating and drying the composition for the adhesive film are not particularly limited, and for example, a method of coating a composition including each of the components as it is or as being dissolved in a proper organic solvent using known means such as a comma coater, a gravure coater, a die coater or a reverse coater, and drying the solvent for 10 seconds to 30 minutes at a temperature of 60° C. to 200° C. may be used. In addition, in the above-mentioned process, an aging process may be additionally performed for sufficiently progressing a crosslinking reaction of the adhesive.

The substrate performs a role of supporting the adhesive film, and may be removed with the adhesive film when removing the adhesive film.

Materials of the substrate are not particularly limited as long as it is capable of performing a role of supporting the adhesive film, and for example, the substrate may be a glass substrate or a flexible substrate. Specifically, the flexible substrate may be a plastic substrate or a plastic film.

The plastic substrate or the plastic film is not particularly limited, and examples thereof may include any one or more of polyacrylate, polypropylene (PP), polyethylene terephthalate (PET), polyethylene ether phthalate, polyethylene phthalate, polybuthylene phthalate, polyethylene naphthalate (PEN), polycarbonate (PC), polystyrene (PS), polyether imide, polyether sulfone, polydimethyl siloxane (PDMS), polyetheretherketone (PEEK) and polyimide (PI).

The substrate being a flexible film has an advantage in that the adhesive film or the conductive heating pattern-provided adhesive film may be wound in a roll and stored so as to be used in a roll-to-roll process.

The thickness of the substrate is not particularly limited, and specifically, may be greater than or equal to 20 μm and less than or equal to 250 μm.

In the adhesive film formed with the composition for the adhesive film, some of functional groups in the adhesive resin, the crosslinking agent and the ultraviolet curable compound bond to maintain minimal mechanical strength for maintaining the film, however, the functional groups remain so as to proceed with additional reactions. When applying an external stimulus for reducing adhesive strength of the adhesive film, the remaining functional groups initiated by an initiator form additional crosslinking, and as a result, the adhesive film becomes hard reducing adhesive strength.

The line height of the conductive heating pattern may be 10 μm or less. The conductive heating pattern having a line height of greater than 10 μm has a disadvantage of increasing metal awareness by light reflection due to a side surface of the metal pattern. According to one embodiment of the present disclosure, the line height of the conductive heating pattern is in a range of greater than or equal to 0.3 μm and less than or equal to 10 μm. According to one embodiment of the present disclosure, the line height of the conductive heating pattern is in a range of greater than or equal to 0.5 μm and less than or equal to 5 μm.

In the present specification, the line height of the conductive heating pattern means a distance from a surface adjoining the adhesive film to a surface opposite thereto.

According to one embodiment of the present disclosure, the conductive heating pattern has a line height deviation of 20% or less and preferably 10% or less. Herein, the deviation means a percentage for a difference between an average line height and an individual line height based on the average line height.

The conductive heating pattern may be formed with thermally conductive materials. For example, the conductive heating pattern may be formed with metallic lines. Specifically, the heating pattern preferably includes metals having excellent thermal conductivity. The heating pattern material favorably has a specific resistance value of greater than or equal to 1 microOhm cm and less than or equal to 200 microOhm cm. Specific examples of the heating pattern material may include copper, silver, aluminum and the like.

As the conductive heating pattern material, copper that is inexpensive and has excellent electrical conductivity is most preferred.

The conductive heating pattern may include a pattern of metallic lines formed with straight lines, curves, zigzags or combinations thereof. The conductive heating pattern may include regular patterns, irregular patterns or combinations thereof.

The total aperture ratio of the conductive heating pattern, that is, a proportion of the substrate region that is not covered by the conductive heating pattern is preferably 90% or greater.

The conductive heating pattern has a line width of 40 μm or less, and specifically 0.1 μm to 40 μm. The conductive heating pattern has line to line spacing of 50 μm to 30 mm.

As shown in FIG. 1, the heating element may include an adhesive film (100); and a conductive heating pattern (200) on the adhesive film (100). Herein, the line height is h, the line to line spacing is p, and the line width is w in the conductive heating pattern (200).

The conductive heating pattern may be formed by forming a metal film on at least one surface of the adhesive film and then patterning the metal film, or may be formed by transferring a patterned metal pattern on the adhesive film.

The metal film may be formed using methods of deposition, plating, metal foil lamination and the like, and a conductive heating pattern may be formed by forming an etching protective pattern on the metal film using photolithography, an inkjet method, a plate printing method, a roll printing method or the like, and then etching the metal film that is not covered by the etching protective pattern.

The conductive heating pattern may be formed by directly transferring a patterned metal pattern on the adhesive film. Herein, the patterned metal pattern may be formed using lamination of metal pattern-provided metal foil or a roll printing method.

The heating element according to another embodiment of the present disclosure may further include a protective film provided on the surface of the adhesive film provided with the conductive heating pattern. Specifically, as necessary in terms of a process or depending on uses in final applications, the heating element may be moved or dealt while attaching a protective film (or a release film) to be removed later without attaching a transparent substrate. As types of the protective film, those known in the art may be used, and examples thereof may include plastic films, plastic films coated with release materials, papers, papers coated with release materials, or films of which surfaces are embossing treated.

The heating element provided with the protective film on the surface of the adhesive film provided with the conductive heating pattern may be stored, moved or dealt while being wound in a roll.

The heating element according to one embodiment of the present specification may further include a darkening pattern provided at least one of on the conductive heating pattern or between the conductive heating pattern and the adhesive film.

The darkening pattern may be provided in a region corresponding to the conductive heating pattern, may specifically be provided on an upper surface and/or a lower surface of the conductive heating pattern, and may be provided on at least a part of a side surface as well as on an upper surface and a lower surface of the conductive heating pattern, and may be provided on the whole upper surface, lower surface and side surface of the conductive heating pattern.

In the present specification, by providing the darkening pattern on an upper surface and/or a lower surface of the conductive heating pattern, reflectivity-dependent visibility of the conductive heating pattern may be reduced.

In the present specification, the darkening pattern may be patterned either together with or separately from the conductive heating pattern, however, layers for forming each pattern are separately formed. However, in order for the conductive heating pattern and the darkening pattern to be present on surfaces precisely corresponding to each other, the conductive pattern and the darkening pattern are most preferably formed at the same time.

In the present specification, the darkening pattern and the conductive heating pattern are distinguished from structures in which at least some of light-absorbing materials are sunk or dispersed into the conductive heating pattern, or structures in which a part of a surface side is physically or chemically modified by surface treatment of a single conductive layer in that separate pattern layers form a lamination structure.

In addition, in the present specification, the darkening pattern (400) is provided directly on the adhesive film (100) or directly on the conductive pattern (200), as shown in FIG. 3, without interposing an additional bonding layer or adhesive layer.

The darkening pattern may be formed in a single layer or may be formed in a multiple layer of two or more layers.

The darkening pattern is preferably close to colors of achromatic color series. However, the darkening pattern is not necessarily an achromatic color, and may be introduced when having low reflectivity even when having colors. Herein, the color of achromatic color series means a color appearing when light entering on a surface of an object is evenly reflected and absorbed for wavelengths of each component without being selectively absorbed. In the present specification, as the darkening pattern, materials having a total reflection standard deviation for each wavelength range of 50% or less when measuring total reflection in a visible region (400 nm to 800 nm) may be used.

As materials of the darkening pattern, black dyes, black pigments, metals, metal oxides, metal nitrides or metal oxynitrides having the physical properties described above when forming a front surface layer may be preferably used without particular limit as a light absorbing material. For example, the darkening pattern may be formed with a photolithography method, an ink jet method, a printing method, a roll printing method or the like using a composition including black dyes or black pigments, or may be formed by pattering an oxide film, a nitride film, an oxide-nitride film, a carbide film, a metal film or combinations thereof formed using Ni, Mo, Ti, Cr and the like under a deposition condition and the like set by those skilled in the art.

The darkening pattern preferably has a pattern form having the same or a larger line width than the line width of the conductive heating pattern.

When the darkening pattern has a pattern form having a larger line width than the line width of the conductive heating pattern, an effect of the darkening pattern shielding the conductive heating pattern may be more greatly provided when users see, which leads to an advantage of efficiently blocking an effect obtained by gloss or reflection of the conductive pattern itself. However, target effects of the present specification may be accomplished even when the darkening pattern has the same line width as the conductive pattern.

As shown in FIG. 2, the heating element according to one embodiment of the present specification may further include a substrate (300) provided on a surface opposite to the surface of the adhesive film (100) provided with the conductive heating pattern.

The substrate performs a role of supporting the adhesive film, and may be removed with the adhesive film when removing the adhesive film.

Materials of the substrate are not particularly limited as long as it is capable of performing a role of supporting the adhesive film, and for example, the substrate may be a glass substrate or a flexible substrate. Specifically, the flexible substrate may be a plastic substrate or a plastic film. The plastic substrate or the plastic film is not particularly limited, and examples thereof may include any one or more of polyacrylate, polypropylene (PP), polyethylene terephthalate (PET), polyethylene ether phthalate, polyethylene phthalate, polybuthylene phthalate, polyethylene naphthalate (PEN), polycarbonate (PC), polystyrene (PS), polyether imide, polyether sulfone, polydimethyl siloxane (PDMS), polyetheretherketone (PEEK) and polyimide (PI).

The substrate being a flexible film has an advantage in that the adhesive film or the conductive heating pattern-provided adhesive film may be wound in a roll and stored so as to be used in a roll-to-roll process.

The thickness of the substrate is not particularly limited, and specifically, may be greater than or equal to 20 μm and less than or equal to 250 μm.

The heating element may further include bus bars provided on both ends of the conductive heating pattern. In addition, the heating element may further include a power supply unit connected to the bus bar.

According to another embodiment of the present disclosure, a black pattern may be provided in order to conceal the bus bar. For example, the black pattern may be printed using a paste containing a cobalt oxide. Herein, screen printing is suited as the printing method, and the thickness may be set at 10 μm to 100 μm. The conductive heating pattern and the bus bar may each be formed before or after forming the black pattern.

The heating element may be stored, moved or dealt while laminating a bonding layer on one surface of the adhesive film provided with the conductive heating pattern. Specifically, the heating element laminating a bonding layer on one surface of the adhesive film provided with the conductive heating pattern may be stored, moved or dealt while being wound in a roll. Herein, a protective film (or a release film) to be removed later may be further included on a surface opposite to the surface of the bonding layer provided with the conductive heating pattern, and the heating element may be stored, moved or dealt while being wound in a roll in this state.

When laminating a bonding layer on one surface of the adhesive film provided with the conductive heating pattern, the conductive heating pattern on the adhesive film may be embedded to the bonding layer side. Specifically, the bonding layer completely covers the conductive heating pattern in a region with the conductive heating pattern, and is bonded to the adhesive film in a region without the conductive heating pattern, and the conductive heating pattern on the adhesive film may be sealed by the bonding layer so that there is almost no space between the conductive heating pattern-provided adhesive film and the bonding layer.

When laminating a bonding layer on one surface of the adhesive film provided with the conductive heating pattern, only the conductive heating pattern may be transferred on the bonding layer by applying an external stimulus to the adhesive film and reducing adhesive strength before the lamination, or only the heating pattern may be transferred by reducing adhesive strength of the adhesive film after laminating the adhesive film and the bonding layer. After bringing the conductive heating pattern transferred on the bonding layer into contact with the bus bar, the result is laminated with a transparent substrate to manufacture the heating element.

When, after laminating the bonding layer on one surface of the adhesive film provided with the conductive heating pattern, the adhesive film is removed and only the heating pattern is transferred on the bonding layer, the heating element may be stored, moved or dealt while the conductive heating pattern is embedded to the bonding layer side. A protective film (or a release film) to be removed later may be further included on at least one surface of the bonding layer provided with the conductive heating pattern, and the heating element may be stored, moved or dealt while being wound in a roll in this state.

When laminating a transparent substrate on one surface of the adhesive film provided with the conductive heating pattern, adhesive strength is reduced by applying an external stimulus to the adhesive film before or after the lamination, and by removing the adhesive film after laminating to the transparent substrate, only the conductive heating pattern may be transferred on the transparent substrate.

The transparent substrate means a transparent substrate of an end product to use a heating element, and for example, the transparent substrate may be a glass substrate and preferably may be automotive glass.

According to embodiments described in the present specification, the conductive heating pattern may be formed on a transparent substrate of an end product so that the transparent substrate for forming the conductive heating pattern does not remain in the end product. As described above, by an adhesive film being removed, films other than a bonding film used for bonding transparent substrates of an end product may not be additionally used between the two transparent substrates of the end product, and view distortions caused by refractive index differences between the films may be prevented.

The heating element according to the present disclosure may be connected to a power supply for heating, and herein, the heating value may be from 100 W to 1000 W and preferably from 200 W to 700 W per $m^2$. The heating element according to the present disclosure has excellent heating performance even at low voltages, for example, 30 V or less and preferably 20 V or less, and therefore, is useful in automobiles and the like. Resistance in the heating element is 2 ohm/square or less, preferably 1 ohm/square or less and more preferably 0.5 ohm/square or less. The resistance value obtained herein has the same meaning as sheet resistance.

According to another embodiment of the present disclosure, the heating element may be a heating element for automotive glass.

According to another embodiment of the present disclosure, the heating element may be a heating element for automotive front glass.

Hereinafter, the present specification will be described in more detail with reference to examples. However, the following examples are for illustrative purposes only, and not to limit the present specification.

EXAMPLE

Example 1

Preparation of (Meth)Acrylate-Based Resin

To a reactor in which nitrogen gas is refluxed and a cooling device is installed so as to readily control a temperature, a mixture of monomers formed with 98.5 parts by weight of 2-ethylhexyl acrylate (2-EHA) and 13.5 parts by weight of hydroxyethyl acrylate (HEA) was introduced. Subsequently, 400 ppm of n-dodecyl mercaptan (n-DDM), a chain transfer agent (CTA), and 100 parts by weight of ethyl acetate (EAc), a solvent, were introduced based on 100 parts by weight of the monomer mixture, and the result was sufficiently mixed for 30 minutes or longer at 30° C. while injecting nitrogen to remove oxygen inside the reactor. After that, the temperature was raised and maintained at 62° C., and V-60 (azobisisobutylonitrile), a reaction initiator, was introduced thereto in a concentration of 300 ppm to initiate a reaction, and a first reactant was prepared through polymerization for 6 hours.

To the first reactant, 15.3 parts by weight of 2-methacryloyloxyethyl isocyanate (MOI) (80 mol % with respect to HEA in the first reactant) and 1 weight % of a catalyst (dibutyl tin dilaurate: DBTDL) with respect to the MOI were mixed, and the result was reacted for 24 hours at 40° C. to prepare a (meth)acrylate-based polymer resin by introducing a ultraviolet curing group to a polymer side chain in the first reactant.

Preparation of Adhesive Film

An adhesive composition was prepared by mixing 3 g of toluene diisocyanate (TDI)-based isocyanate crosslinking agent and 4 g of an initiator (Irgacure 184) to 100 g of the (meth)acrylate-based polymer resin prepared above. The adhesive composition was coated on release-treated PET having a thickness of 38 µm, and the result was dried for 3 minutes at 110° C. to prepare an adhesive film having a thickness of 10 µm. The formed adhesive film was laminated on a 150 µm polyethylene terephthalate substrate film and then the result went through aging to prepare an adhesive film.

Manufacture of Heating Element

After depositing Cu of 2 µm on the adhesive film using an E-beam evaporator, an etching protective pattern made of a novolac resin as a main component was formed on the copper film using a reverse offset printing process. After additionally drying the result for 5 minutes at 100° C., the copper in the exposed portion was etched through an etching process, and as a result, a copper pattern was formed on the adhesive film. Herein, the line width of the formed copper pattern was from 11 µm to 12 µm.

Example 2

After depositing Cu of 2 µm on the adhesive film prepared in Example 1 using an E-beam evaporator, an etching protective pattern was formed using a photolithography method. Specifically, the etching protective pattern was formed by forming an ink film on the copper film using a photoresist ink through spin coating, and drying the result for 5 minutes at approximately 100° C. The dried specimen was placed in a photolithography device and exposed using a mask of a target pattern, and then the ink film in the portion that is shielded by the mask and not exposed to light was removed using a peel-off solution. After etching the copper in the exposed portion through an etching process, the ink was all removed to form a copper pattern. Herein, the line width of the formed copper pattern was from 12 µm to 13 µm.

Comparative Example 1

After depositing Cu of 2 µm on a general adhesive film using an E-beam evaporator, an etching protective pattern made of a novolac resin as a main component was formed on the copper film using a reverse offset printing process. After additionally drying the result for 5 minutes at 100° C., the copper in the exposed portion was etched through an etching process, and as a result, a copper pattern was formed on the adhesive film. Herein, the line width of the formed copper pattern was from 12 µm to 13 µm.

Experimental Example 1

Results of observing the copper patterns prepared in Examples 1 and 2 and Comparative Example 1 using an optical microscope are shown in FIG. 4.

Through FIG. 4, it was identified that a metal pattern having a line height of 10 µm or less was able to be prepared on the adhesive film.

Experimental Example 2

Using the conductive heating pattern-formed adhesive film prepared in Example 1, a bonding film (PVB) and a conductive heating pattern were bonded using a hot laminator, and after changing adhesive strength of the adhesive film through an external stimulus (ultraviolet rays), the adhesive film was removed.

After bonding to a bonding film (PVB) using the conductive heating pattern formed on the general adhesive film prepared in Comparative Example 1 with a hot laminator, the adhesive film was removed.

Conductive heating pattern transfer properties of Example 1 and Comparative Example 2 were compared. The results are shown in Table 1.

TABLE 1

|  | Example 1 | Comparative Example 1 |
| --- | --- | --- |
| Pattern Transferability | ○ | x |

Pattern transferability means a property of the conductive heating pattern formed on the adhesive film being transferred to the bonding film (PVB).

O: the conductive heating pattern was 100% transferred on the bonding film, and was transferred in the same state as the initial state without generating pattern disconnections and wrinkles x: the conductive heating pattern was not transferred on the bonding film, and was not able to work as a heating film due to generation of pattern disconnections

The invention claimed is:

1. A heating element comprising:
   an adhesive film; and
   a conductive heating pattern provided on the adhesive film,
   wherein the adhesive film has an adhesive strength decrement of 30% or greater by an external stimulus based on adhesive strength before the external stimulus,
   wherein the adhesive film is formed from a composition comprising 100 parts by weight of the adhesive resin, 0.1 to 20 parts by weight of an initiator, 0.1 to 40 parts by weight of a crosslinking agent, and 5 to 200 parts by weight of an ultraviolet curable compound,
   wherein the ultraviolet curable compound is included in a side chain of the adhesive resin by substituting 5 to 90 mol % of a crosslinking functional group of the adhesive resin,
   wherein the adhesive resin is a (meth)acrylate-based resin with an average molecular weight of 400,000 g/mol to 2,000,000 g/mol, and wherein the adhesive film has a thickness of greater than or equal to 5 μm and less than 100 μm.

2. The heating element of claim 1, wherein the external stimulus is one or more of heat, light irradiation, a pressure and a current.

3. The heating element of claim 1, wherein the external stimulus is ultraviolet irradiation.

4. The heating element of claim 1, further comprising a substrate provided on a surface opposite to the surface of the adhesive film provided with the conductive heating pattern.

5. The heating element of claim 1, further comprising a darkening pattern provided at least one of on the conductive heating pattern and between the conductive heating pattern and the adhesive film.

6. The heating element of claim 1, wherein the conductive heating pattern has a line height of 10 pm or less.

* * * * *